United States Patent
Knobel et al.

(10) Patent No.: US 7,025,827 B2
(45) Date of Patent: Apr. 11, 2006

(54) DOPED SEMICONDUCTOR WAFER OF FLOAT ZONE PULLED SEMICONDUCTOR MATERIAL, AND PROCESS FOR PRODUCING THE SEMICONDUCTOR WAFER

(75) Inventors: Rolf Knobel, Emmerting (DE); Wilfried Von Ammon, Hochburg/Ach (AT); Janis Virbulis, Burghausen (DE); Manfred Grundner, Burghausen (DE)

(73) Assignee: Siltronic AG, Munich (DE)

( * ) Notice: Subject to any disclaimer, the term of this patent is extended or adjusted under 35 U.S.C. 154(b) by 104 days.

(21) Appl. No.: 10/410,812

(22) Filed: Apr. 10, 2003

(65) Prior Publication Data

US 2003/0192470 A1  Oct. 16, 2003

(30) Foreign Application Priority Data

Apr. 15, 2002  (DE) .............................. 102 16 609

(51) Int. Cl.
*C30B 11/02*  (2006.01)

(52) U.S. Cl. .............................. 117/51; 117/50; 117/52; 117/931

(58) Field of Classification Search .................. 117/51, 117/52, 931, 50
See application file for complete search history.

(56) References Cited

U.S. PATENT DOCUMENTS

| | | | |
|---|---|---|---|
| 5,258,092 A | * | 11/1993 | Yamagishi et al. ........... 117/52 |
| 5,349,921 A | * | 9/1994 | Barraclough et al. ......... 117/13 |
| 5,556,461 A | * | 9/1996 | Kimura et al. ................ 117/51 |
| 2002/0022348 A1 | * | 2/2002 | Sakaguchi et al. .......... 438/480 |

FOREIGN PATENT DOCUMENTS

| | | |
|---|---|---|
| DE | 263310 | 12/1988 |
| DE | 10051885 | 5/2002 |
| EP | 0504929 | * 9/1992 |

OTHER PUBLICATIONS

English Derwent Abstract AN 1989-158229 corresponding to DD 263310.
English Derwent Abstract AN 2002-395730 corresponding to DE 10051885.

* cited by examiner

*Primary Examiner*—Robert Kunemund
(74) *Attorney, Agent, or Firm*—Brooks Kushman P.C.

(57) ABSTRACT

A doped semiconductor wafer of float zone-pulled semiconductor material contains a dopant added to a molten material and has a radial macroscopic resistance distribution of less than 12% and striations of −10% to +10%. There is also a process for producing a doped semiconductor wafer by float zone pulling of a single crystal and dividing up the single crystal, in which process, during the float zone pulling, a molten material which is produced using an induction coil is doped with a dopant. It is exposed to at least one rotating magnetic field and is solidified. The single crystal which is formed during the solidification of the molten material is rotated. The single crystal and the magnetic field are rotated with opposite directions of rotation and the magnetic field has a frequency of 400 to 700 Hz.

5 Claims, 5 Drawing Sheets

Spreading Resistance 4" - Wafer
Float zone pulling process with rotating magnetic field Spreading Resistance 4" - Wafer
Float zone pulling process without rotating magnetic field

DOPED SEMICONDUCTOR WAFER OF FLOAT ZONE PULLED SEMICONDUCTOR MATERIAL, AND PROCESS FOR PRODUCING THE SEMICONDUCTOR WAFER

BACKGROUND OF THE INVENTION

1. Field of the Invention

The invention relates to a doped semiconductor wafer of float zone-pulled semiconductor material and to a process for producing the semiconductor wafer. The process comprises the production of a doped single crystal by float zone pulling (floating zone crystal growth, FZ method) and the division of the single crystal into semiconductor wafers. During the pulling of the single crystal, a molten material which has been produced using an induction coil is exposed to at least one rotating magnetic field and is solidified. The single crystal which is formed during the solidification of the molten material is rotated.

2. The Prior Art

The use of a rotating magnetic field in float zone pulling is described, for example, in DD-263 310 A1. However, the process which is proposed in this document attempts to make the diffusion boundary layer thickness more uniform. However the present invention achieves the most homogeneous distribution of dopants added to the molten material possible and of reducing striations. A homogeneous dopant distribution manifests itself in a tight radial macroscopic resistance distribution.

Striations are macroscopic dopant fluctuations. They are usually quantified by carrying out a spreading resistance analysis on the semiconductor wafer.

The radial macroscopic resistance distribution is measured by the four-point methods described in ASTM F 84, taking a mean over a length of several millimeters.

Hitherto, it has been attempted to homogenize the dopant distribution and therefore reduce the radial resistance variation by varying the crystal rotation, by displacing the induction coil relative to the crystal axis and by changing the shape of the induction coil. A drawback of these measures is that they often lead to an increase in the dislocation rate and to a reduction in the process stability.

It is also known that very flat radial dopant profiles can be set by neutron doping. However, neutron doping has a large number of drawbacks. For example, the method is only suitable for semiconductor material with a resistance of approximately 3 to approximately 800 Ohm*cm. Radiation damage which has to be annealed by a thermal aftertreatment is inevitably produced. Nevertheless, it is impossible to prevent a reduction in the minority charge carrier life. Furthermore, necessary decay times, the thermal aftertreatment and associated conveying operations make the method time-consuming and expensive.

SUMMARY OF THE INVENTION

The present invention is directed to a doped semiconductor wafer of float zone-pulled semiconductor material which contains a dopant added to a molten material and has a radial macroscopic resistance distribution of less than 12% and striations of −10% to +10%.

The present invention is also directed to a process for producing a doped semiconductor wafer by float zone pulling of a single crystal and dividing up the single crystal, in which process, during the float zone pulling, a molten material which is produced using an induction coil is doped with a dopant, exposed to at least one rotating magnetic field and is solidified, and the single crystal which is formed during the solidification of the molten material is rotated, the single crystal and the magnetic field being rotated with opposite directions of rotation and the magnetic field having a frequency of 400 to 700 Hz.

The selected frequency range is important because in this range the power required to drive the magnet system is low and, at the same time, the flow of molten material can be influenced most successfully within the context of the invention.

A silicon semiconductor wafer produced using the process of the invention, has a radial macroscopic resistance distribution which is similar to that of a neutron-doped semiconductor wafer. The wafer can have a minority charge carrier life of at least 100 μsec. However, with regard to the resistance ranges there is no restriction similar to that encountered with neutron-doped material. For example, the resistances may be from below 3 Ohm*cm to above 800 Ohm*cm, preferably from 0.05 to 8000 Ohm*cm. Furthermore, the process of the invention, has the advantage that fluctuations in the resistances of the semiconductor wafers which originate from one single crystal are less than +/−8%.

BRIEF DESCRIPTION OF THE DRAWINGS

Other objects and features of the present invention will become apparent from the following detailed description considered in connection with the accompanying drawings which disclose several embodiments of the present invention. It should be understood, however, that the drawings are designed for the purpose of illustration only and not as a definition of the limits of the invention.

In the drawing, wherein similar reference characters denote similar elements throughout the several views:

FIG. 6 shows a comparative illustration of measurements of the spreading resistance values for silicon semiconductor wafers with a diameter of 4 inches. The top diagram

DETAILED DESCRIPTION OF PREFERRED EMBODIMENTS

Figure 1:
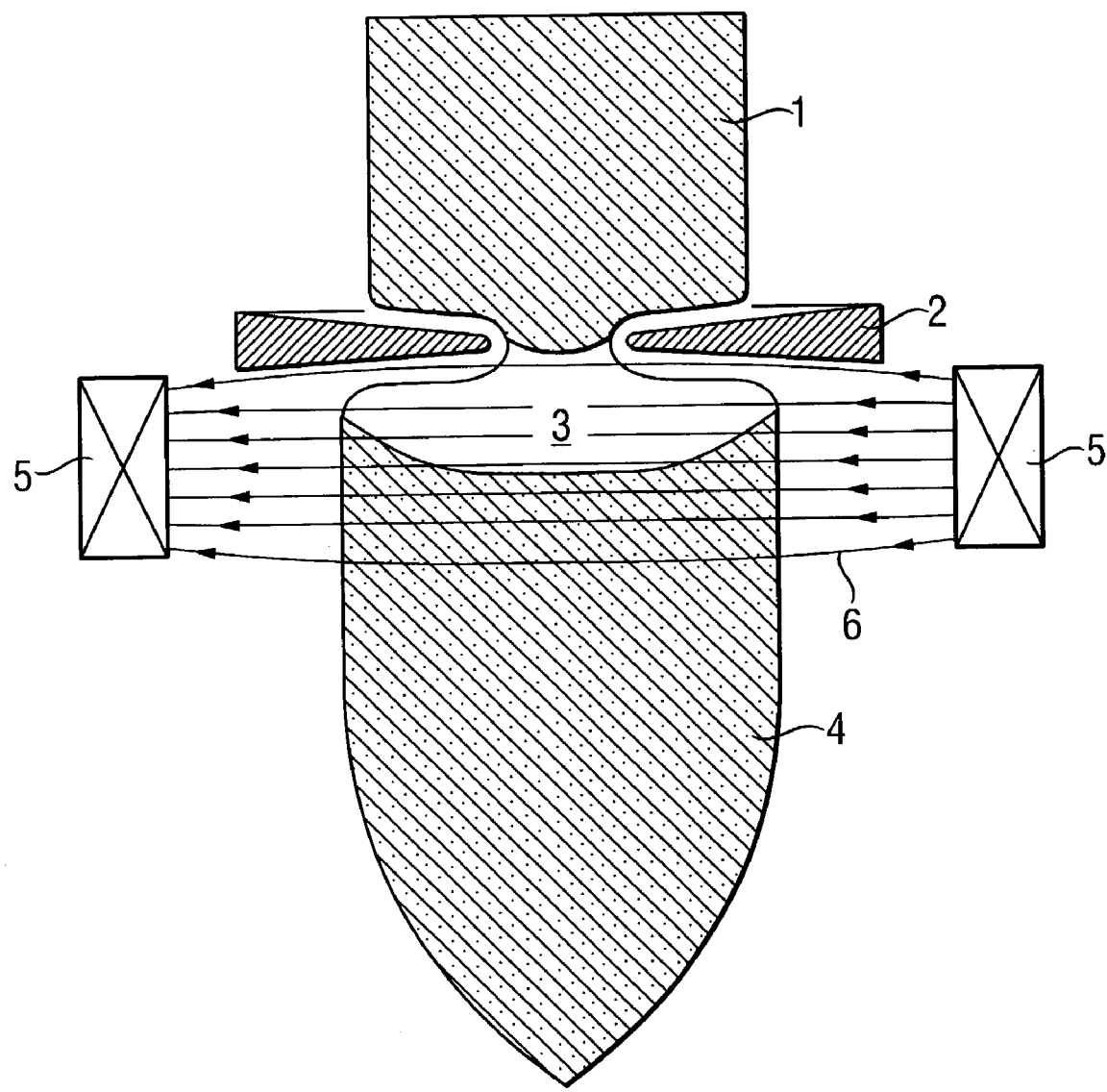
FIG. 1 shows an arrangement which is suitable for carrying out the process.

Turning now in detail to the drawings, the arrangement illustrated in FIG. 1 comprises a single crystal 4, which is connected to a polycrystalline stock ingot 1 via a molten material 3. The molten material is produced by an induction coil 2. During the lowering of the single crystal, some of the molten material solidifies, so that the volume of the single crystal increases. At the same time, the induction coil causes material of the stock ingot to melt, and in this way the volume of the molten material is increased.

According to the invention, a magnet system 5 with at least three poles or a multiple thereof is to be provided, such as for example the system used in a three-phase electric motor with three-pole stator. This generates a magnetic field which rotates in the opposite direction to the direction of rotation of the single crystal. The magnet system is preferably shielded from thermal radiation and water-cooled. It is also preferable for it to be possible for the field strength of the magnetic field to be varied between 0 and 100% by means of a potentiometer. The field lines 6 of the magnetic field are illustrated by arrows in FIG. 1.

Figure 2:
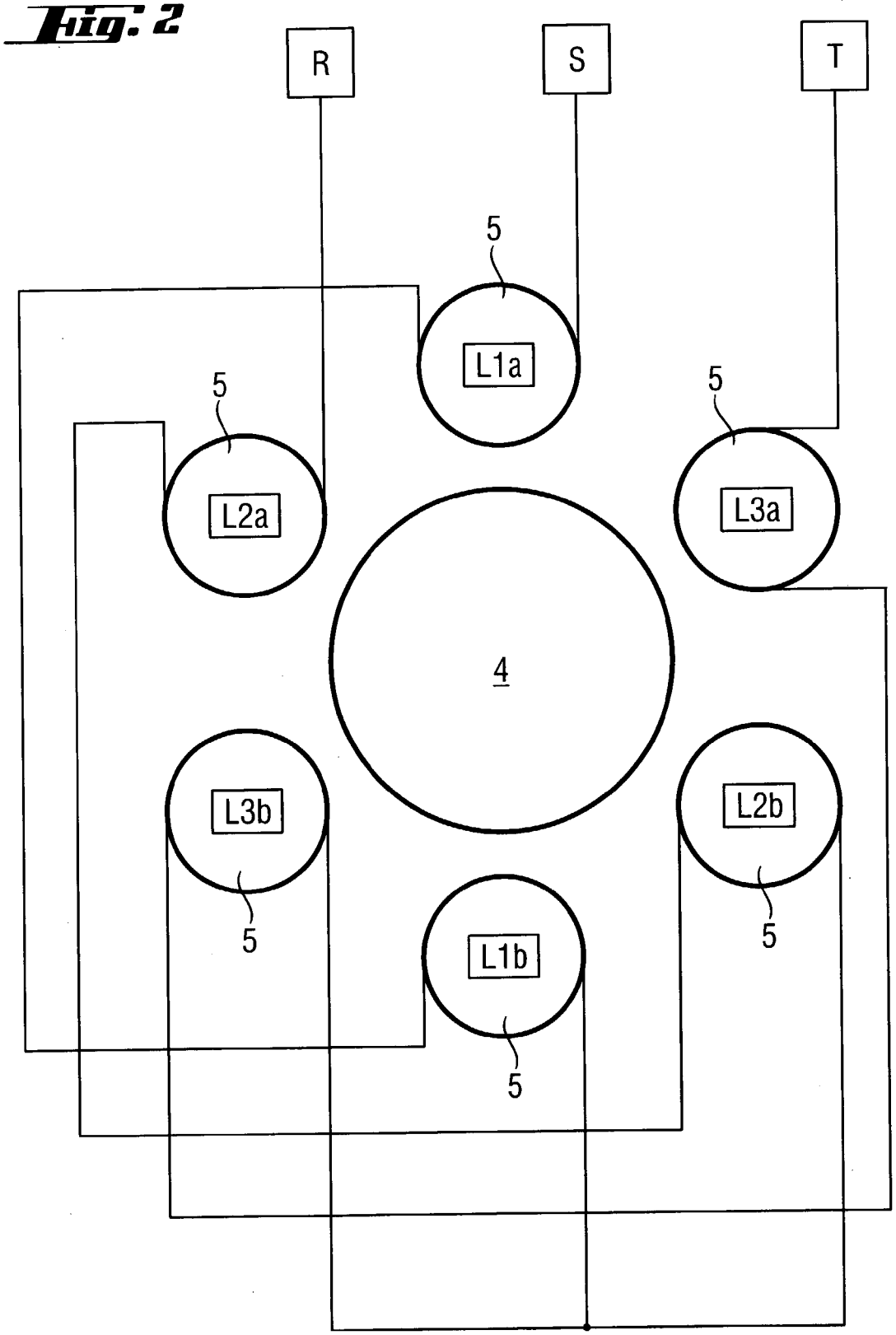
FIG. 2 shows a preferred arrangement of a magnet system around a single crystal.

The arrangement illustrated in FIG. 2, comprises a 6-pole magnet system 5 with three-phase driving. This is formed by six individual magnets (L1a–L3b) distributed uniformly around the single crystal, with in each case two opposite poles corresponding, is particularly preferred.

Figure 3:
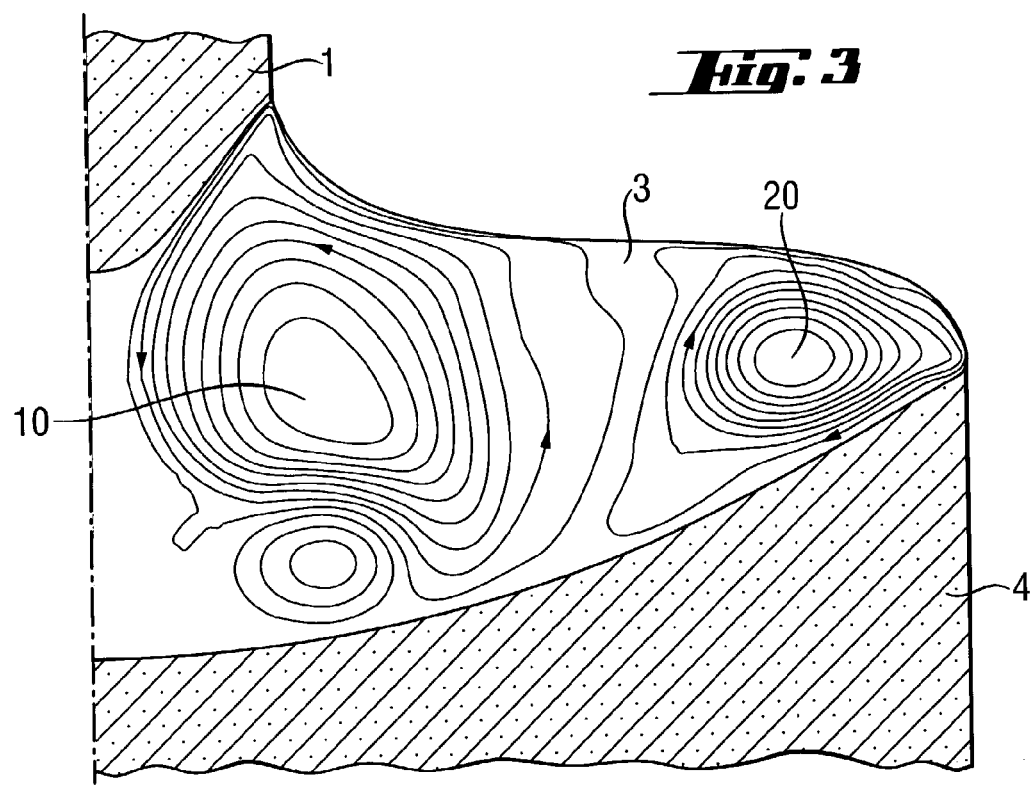
FIGS. 3 and 4 reproduce the flow conditions in the molten material which have been calculated in simulation calculations, the figures in each case illustrating only one of two symmetrical halves of a section through the molten material.

The dopant distribution in the single crystal is influenced by the flow conditions in the molten material and by boundary layer diffusion. The flow in the molten material, which is produced by the thermal, Marangoni and electromagnetic forces, has a typical twin-eddy structure, which is illustrated in FIG. 3, in particular for single crystals with large diameters. In the central eddy 10, which is in contact with a polycrystalline stock ingot, the dopant concentration is lower than in an outer eddy 20. As long as these differences in concentration are present in the two eddies, making the diffusion boundary layer thickness more uniform has no effect with regard to radial dopant homogenization.

In the center, the flow is directed downward toward the single crystal, which immediately has two drawbacks. Firstly, the downwardly directed flow causes fractions of molten material which contain relatively little dopant to pass to the growth front of the single crystal, while there are higher levels of dopant in the vicinity of the edges. Secondly, particles which originate from the stock ingot also pass to the growth front together with the flow, where they have an adverse effect on the dislocation-free growth of the single crystal.

Figure 4:
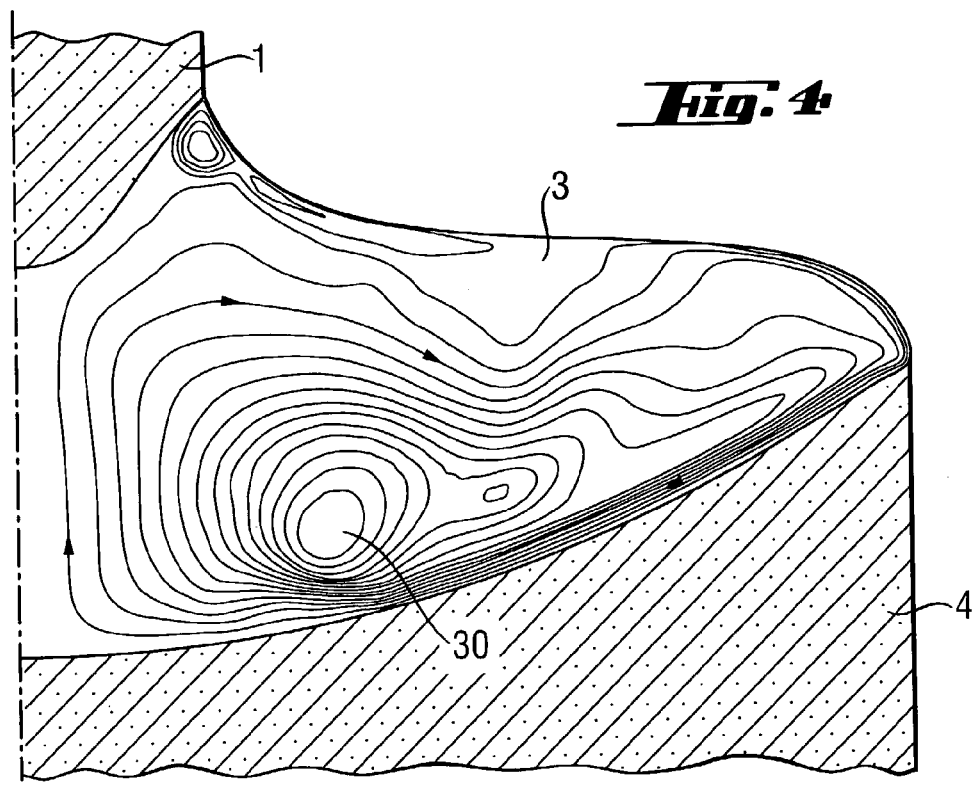

The inventive application of a rotating magnetic field converts the twin-eddy structure into a single-eddy structure with altered flow conditions. A single-eddy structure 30 of this type is illustrated in FIG. 4. The molten material now forms a single area in which the flow in the center is directed upward, i.e. toward the stock ingot. As a result, dopant is conveyed from the edge regions into the center, so that the dopant concentration in the molten material becomes more uniform. The altered flow also forces particles to take a longer route to the growth front. In general, therefore, the particles are left with sufficient time to melt completely before they reach the growth front, so that the dislocation rate is greatly reduced.

To optimally exploit the effect, the rotation of the single crystal and the direction of rotation of the magnetic field have to be set in such a way that on average over the course of time an opposite direction of rotation results. The rotational speed of the single crystal is at least 1 rpm. If the single crystal is subject to alternating rotation (a periodic change in the direction of rotation), which is also possible in accordance with the invention, the rotation of the crystal taken as an average over the course of time is the decisive factor in defining the direction of rotation of the crystal. It is also possible for the direction of rotation of the magnetic field to be alternated accordingly.

The following variants are preferred: the single crystal executes a monodirectional rotation in just one direction or an alternating rotation which is taken as an average over the course of time. This results in a rotation in this direction, while the magnetic field rotates in the opposite direction. Or the single crystal executes a monodirectional rotation, while the direction of rotation of the magnetic field alternates but taken as an average over the course of time is directed in the opposite direction.

To achieve the change from the twin-eddy structure of FIG. 3 to the single-eddy structure of FIG. 4, the field strength of the magnetic field has to be matched to the prevailing process conditions. The form and scatter of the radial resistance profile can be corrected within wide limits by varying the magnetic field strength.

The optimum field strength is dependent on other process parameters, such as the frequency of the magnetic field, the diameter and the rotational speed of the single crystal, the pulling rate and the shape of the induction coil used. It is therefore to be determined by tests.

Tests carried out by the inventors have indicated that the process is preferably used to pull silicon single crystals which have a diameter of at least 3" (76.2 mm). Tests also indicate that the field strength of the rotating magnetic field can be in the range from 1 to 20 mT, and particularly preferably from 1 to 2.5 mT. The frequency of the rotating magnetic field can be in the range from 400 to 700 Hz, and particularly preferably in the range from 450 to 650 Hz. Above 700 Hz, the action of forces becomes saturated, since the depth of penetration into the molten material is considerably less than the height of the vessel holding the molten material. Furthermore, the technical problems increase, on account of the inevitably higher voltages. Below 400 Hz, the action of the forces becomes too low to achieve the desired effect with reasonable technical outlay.

The rotating magnetic field may be symmetrical or asymmetrical with respect to the axis of rotation of the single crystal. An asymmetrical field can be produced by different driving of individual magnets with a regular arrangement of the individual magnets. It can also be produced by an asymmetrical arrangement of individual magnets or by tilting the regularly arranged individual magnets out of the horizontal plane.

Simultaneous application of two rotating magnetic fields with different frequencies and field strengths makes it possible to improve the intimate mixing of the molten material and the radial homogenization of dopants even further. Fields with different frequencies have different penetration depths in the molten material and accordingly act on different areas of molten materials. The direction of rotation of the magnetic fields may be identical or opposite.

It is preferable if the first frequency, which drives the outer area of the molten material, as stated above is from 400 to 700 Hz, particularly preferably 500 Hz, and if the second frequency, which drives the inner area of the molten material, is below 100 Hz, preferably is 50 Hz.

EXAMPLE

Figure 5:
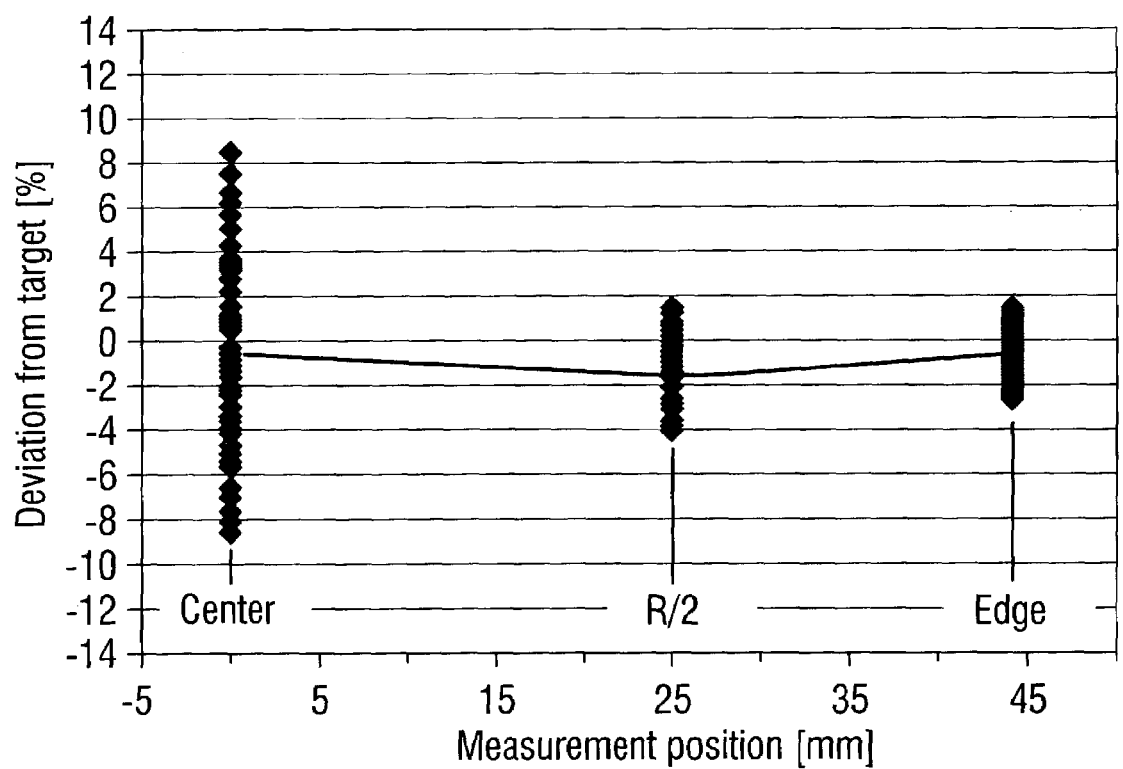
FIG. 5 shows the resistance scatter and profile position for silicon wafers which originate from an FZ single crystal which has been pulled with a rotating magnetic field in accordance with the invention.

Silicon single crystals with a diameter of 4 inches were pulled using the FZ method. Some of the single crystals were pulled using a rotating magnetic field in accordance with the invention, while in others the magnetic field was not used. Then, silicon wafers which had been cut from the single crystals were examined for the distribution of dopants. FIG. 5 shows the resistance scatter and profile position for silicon wafers which originate from an FZ single crystal pulled using a rotating magnetic field in accordance with the invention.

Figure 6A:
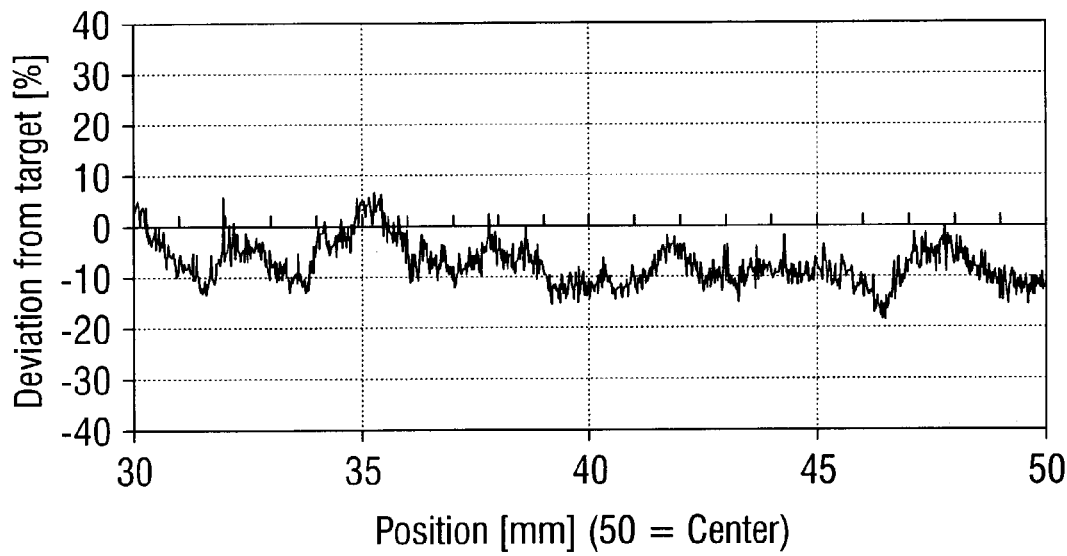
FIG. 6a shows the values for material which has been pulled with a rotating magnetic field in accordance with the invention, while the lower diagram
Figure 6B:
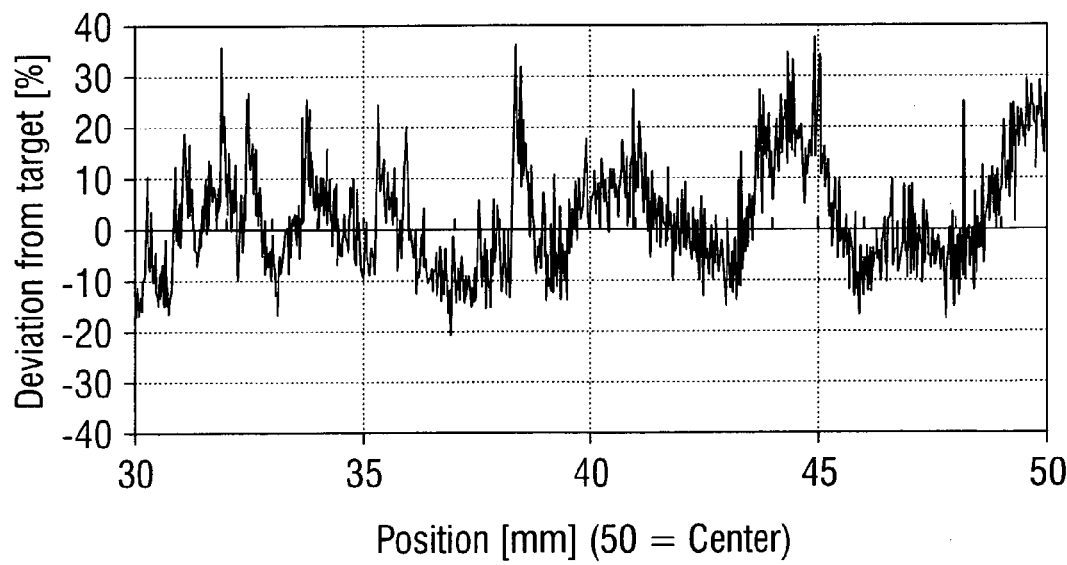
FIG. 6b shows the values for material in which the rotating magnetic field was not used.

FIG. 6 shows a comparative illustration of measurements of the spreading resistance values. FIG. 6a shows the values for material which has been pulled using a rotating magnetic field in accordance with the invention, while FIG. 6b shows the values for material in which the rotating magnetic field was not used.

Accordingly, while a few embodiments of the present invention have been shown and described, it is to be understood that many changes and modifications may be made thereunto without departing from the spirit and scope of the invention as defined in the appended claims.

What is claimed is:

1. A process for producing a doped semiconductor wafer by float zone pulling of a single crystal and dividing up the single crystal comprising during the float zone pulling, a molten material which is produced using an induction coil is doped with a dopant;

exposing the molten material to at least one rotating magnetic field;

solidifying the molten material to produce a single crystal;

rotating the single crystal which is formed during the solidification of the molten material; and rotating the single crystal and the magnetic field with opposite directions of rotation and the magnetic field having a frequency of 400 to 700 Hz.

2. The process as claimed in claim 1,
wherein the magnetic field has a field strength in the range from 1 to 20 mT.

3. The process as claimed in claim 1,
wherein the single crystal is rotated at a speed of at least 1 rpm.

4. The process as claimed in claim 1,
wherein the magnetic field is produced using a 6-pole magnet system.

5. The process as claimed in claim 1, comprising
exposing the molten material to a further rotating magnetic field, which rotates in a maimer selected from the group consisting of in a same direction as the molten material and in an opposite direction to the molten material.

* * * * *